(12) United States Patent
Liaw

(10) Patent No.: US 11,532,623 B2
(45) Date of Patent: *Dec. 20, 2022

(54) SEMICONDUCTOR STRUCTURE HAVING GATE-ALL-AROUND DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 13 days.

This patent is subject to a terminal disclaimer.

(21) Appl. No.: 17/175,862

(22) Filed: Feb. 15, 2021

(65) Prior Publication Data
US 2021/0167065 A1 Jun. 3, 2021

Related U.S. Application Data

(63) Continuation of application No. 16/508,421, filed on Jul. 11, 2019, now Pat. No. 10,923,474.

(60) Provisional application No. 62/739,142, filed on Sep. 28, 2018.

(51) Int. Cl.
| H01L 27/092 | (2006.01) |
| H01L 27/02 | (2006.01) |
| H01L 29/786 | (2006.01) |
| H01L 29/06 | (2006.01) |
| H01L 29/423 | (2006.01) |

(52) U.S. Cl.
CPC ...... *H01L 27/0922* (2013.01); *H01L 27/0207* (2013.01); *H01L 29/0653* (2013.01); *H01L 29/0673* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,613,953 | B2 | 4/2017 | Liaw |
| 9,793,273 | B2 | 10/2017 | Liaw |
| 9,805,985 | B2 | 10/2017 | Liaw |
| 10,490,559 | B1 | 11/2019 | Ando et al. |
| 10,923,474 | B2 * | 2/2021 | Liaw .................. H01L 29/0673 |
| 2020/0105761 | A1 | 4/2020 | Liaw |

* cited by examiner

*Primary Examiner* — Hsien Ming Lee
(74) *Attorney, Agent, or Firm* — Haynes and Boone, LLP

(57) ABSTRACT

An integrated circuit includes gate-all-around (GAA) nanowire transistors and GAA nanosheet transistors on the same substrate. An array of cells including GAA nanowire transistors and cells including nanosheet transistors are provided. The cells including GAA nanowire transistors can be adjacent cells including GAA nanosheet transistors with isolation structures interposing the cells.

20 Claims, 13 Drawing Sheets

FIG. 13

SEMICONDUCTOR STRUCTURE HAVING GATE-ALL-AROUND DEVICES

CROSS-REFERENCE TO RELATED APPLICATION

This application is a continuation of U.S. patent application Ser. No. 16/508,421, filed Jul. 11, 2019, issuing as U.S. Pat. No. 10,923,474, which claims benefit of U.S. Provisional Patent Application Ser. No. 62/739,142, filed Sep. 28, 2018, the entire disclosures of which are incorporated herein by reference.

BACKGROUND

Vertically stacked gate-all-around (GAA) horizontal nanowire (NW) and nanosheet (NS) devices are promising for the next generation integrated circuits (IC) because they have good gate controllability, low leakage, and good scalability. In their channel region, the GAA NW and the GAA NS devices each have multiple vertically stacked wire channels and sheet channels, respectively, which are wrapped around by gate dielectric layer(s) and a gate electrode. Each of GAA NW and GAA NS devices provide benefits. The GAA NW has relative to the GAA NS improved gate control due to smaller channel regions and thus, in some embodiments, is beneficial for application for non-speed critical circuits as it can provide both lower leakage and power consumption advantages. The GAA NS devices have a relatively wider channel width for high speed applications, but the leakage may worse than GA NW devices. It is desired to implement aspects of certain properties of both GAA devices in certain applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 13 shows another standard cell array layout diagrams of a portion of the semiconductor structure, according to aspects of the present disclosure.

DETAILED DESCRIPTION

Figure 1:
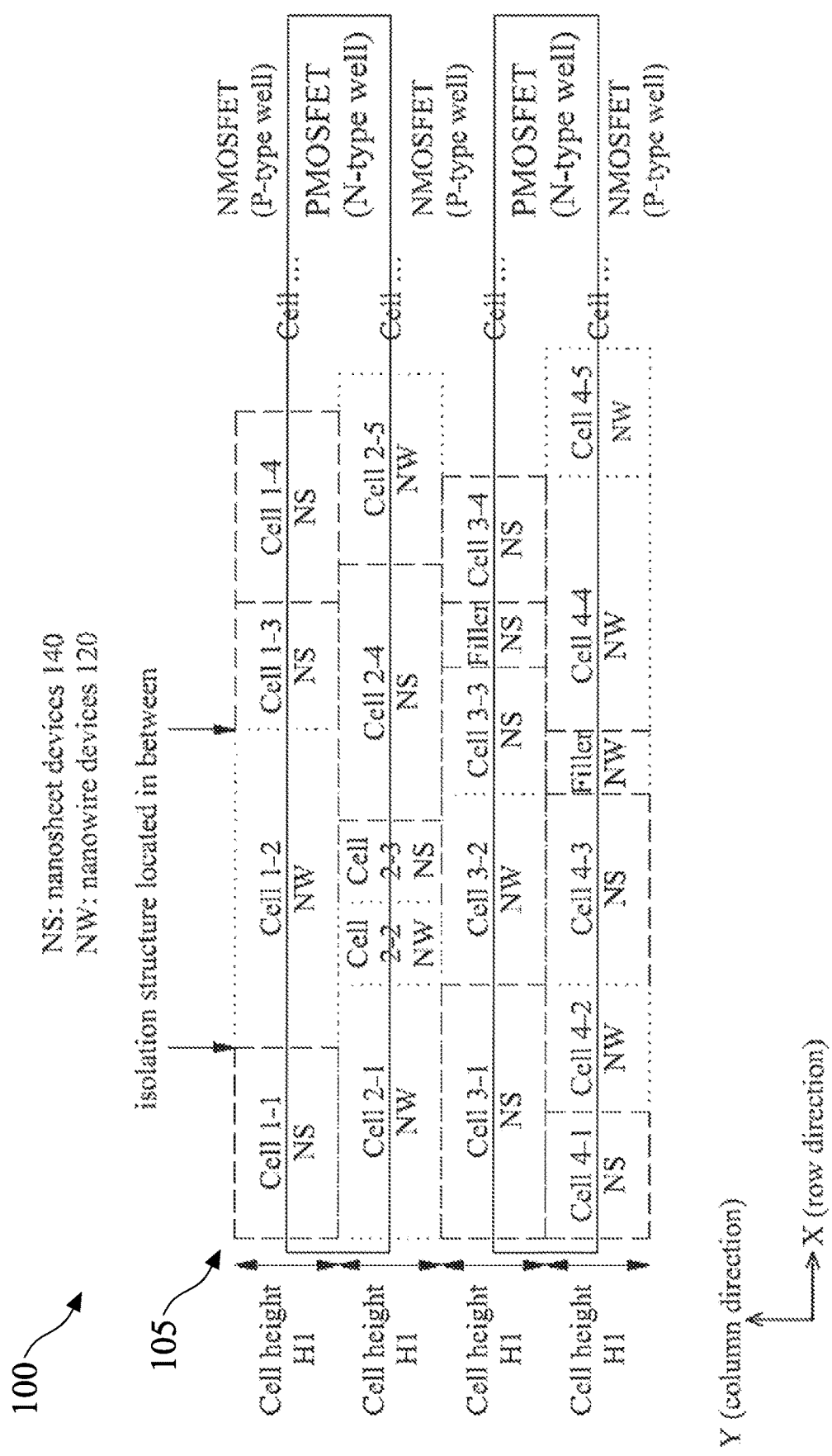
FIG. 1 shows standard cell array layout diagrams of a portion of the semiconductor structure, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

As technology nodes decrease (e.g., 22 nm and beyond generations), some processes have implemented fin-type field effect transistors (FinFET devices) to provide for high performance and lower leakage application. FinFET devices provide this functionality over planar devices due to the control of the gate on multiple sides of the channel—e.g., gate interfacing additional sidewalls device width (Ion performance) as well as better short channel control (subthreshold leakage). However, the FinFET device still has a bottom portion of the channel (within the fin) for which there may be limited gate control. To increase the control, GAA (gate all around) device structure has been proposed as the successor of FinFET device. The present disclosure discusses the implementation of GAA devices. It is noted that the discussion herein can also be applied when implementing FinFET and/or planar devices in conjunction with the GAA devices.

With that understood, the present disclosure is generally related to semiconductor devices and fabrication methods, and more particularly to an integrated circuit (IC) having vertically stacked gate-all-around (GAA) horizontal nanowire (NW) devices (or "GAA NW devices" for short) and vertically stacked GAA horizontal nanosheet (NS) devices (or "GAA NS devices" for short) integrated on the same substrate—collectively referred to as GAA devices.

GAA NW and GAA NS devices differ from one another in channel width, the GAA NS being having a channel width greater than the channel width of the GAA NW devices. For example, the ratio of the GAA NS devices' channel width to the GAA NW devices' channel width may be in a range of 1.3 to 10, such as from 1.5 to 4. As discussed above, with a relatively wider channel, the GAA NS devices may be more suitable for high-speed applications. With a relatively narrower channel, the GAA NW devices may be more suitable for low power and low leakage applications. However, in certain applications such as system on a chip (SOC) devices, it may be desirable to capture the advantages of both GAA NS and GAA NW in a single IC.

Thus, embodiments of the present disclosure provide flexible design integration schemes to accommodate different circuits in the same IC. That is, a GAA NW device has better gate control due to smaller channel regions and can serve for non-speed critical circuit to have both lower leakage and power consumption advantages. The GAA NS devices have a wider channel width for high speed application, but the leakage may worse than GAA NW device. A mix used both devices in adjacent circuits proposed to achieve both high speed and low power consumption requirement for an IC.

Thus, the present disclosure discusses providing structures for semiconductor devices where differently configured GAA device structures are disposed in adjacent circuits. The adjacent circuits (e.g., circuit components or STD cells) can later be interconnected. For example, for a given IC, a first circuit based on GAA NS transistors for high speed application and a second circuit based on GAA NW transistors for power (both active and standby) reduction are interconnected. To provide this functionality, discussed below are STD cell (e.g., circuits or circuit components) layout and construction that allows the cells to be combined in a given device design to meet both high speed and low power consumption such as may be desired to meet SOC product requirements.

Referring to FIG. 1, illustrated is a layout diagram of a portion 105 of a semiconductor device (e.g., an integrated circuit (IC)) 100. The layout 105 may be a portion of a device region of an IC, constructed according to an embodiment of the present disclosure. The device region 105 includes cells (or standard cells (STD cells)), which are circuits or components of circuits arranged in columns and rows. The cells may be interconnected by overlying interconnection layers (e.g., multi-layer interconnects) to form a designed IC functionality. That is, in some embodiments, one or more of the cells of the device region 105 are interconnected to effectuate the IC performance.

FIG. 1 illustrates 4 rows of cells, where cells 1-n (n=1~4) are in a row; cells 2-m (m=1~5) are in a row; cells 3-k (k=1~4) are in a row; and cells 4-p (p=1~5) are in a row. In various embodiments, the rows in the device region 105 may include more cells or less cells than the layout shown in FIG. 1. In various embodiments, the device region 105 may include more rows or less rows and more columns or less columns than the layout shown in FIG. 1. Each cell provides a circuit or portion thereof, exemplary functionality provided by the cells includes, but are not limited to NAND circuit, a NOR circuit, AND circuit, XOR circuit, XNOR circuit, SACN, an inverter, a flipflop, a latch, and/or other suitable logic or storage functions.

Still referring to FIG. 1, each cell is implemented with one or more GAA NW transistors or one or more GAA NS transistors. Specifically, a cell may include a pair of an NMOSFET (or n-type) GAA NS device and a PMOSFET (or p-type) GAA NS device to make a CMOSFET GAA NS cell (or "NS cell" for short); or a cell may include a pair of an NMOSFET GAA NW device and a PMOSFET GAA NW device to make a CMOSFET GAA NW cell (or "NW cell" for short). The n-type GAA NS devices and the n-type GAA NW devices are built on P-type wells. The p-type GAA NS devices and the p-type GAA NW devices are built on N-type wells. GAA NW and GAA NS devices, including their relative channel widths, are discussed above.

In the present embodiment of FIG. 1, each row includes both the NS cells and the NW cells (referred to as a "mixed row"). The height of a mixed row (a dimension along the column direction Y) is dominated by the height of the NS cells in the row. This is because the NS cell has a wider channel than the NW cells in the same row. Thus, all mixed rows in this layout have the same height H1. Some of the mixed rows may further include an isolation structure between an NS cell and an adjacent NW cell. Some of these isolation structures are discussed below. Some of the mixed rows may further include "filler" cells which can provide a function of separating two adjacent cells. The filler cells can be either a non-functional NS cell or a non-functional NW cell. In an embodiment, the filler cells include dummy devices such as the isolation structures discussed below, dummy polysilicon gate lines, and/or other non-functional features. In some embodiments, the filler cells can include dielectric dummy gates, dummy gates (e.g., metal), and/or dummy channel regions such as discussed below. In an embodiment, the filler cells include dielectric dummy gates at a boundary and one or more dummy gates between the dielectric dummy gates.

In an embodiment, a cell such as GAA NW cell has transistors that are all configured as nanowire transistors (e.g., the GAA NW cell does not include FinFET, planar or nanosheet transistors). In an embodiment, a cell such as GAA NS cell has transistors that are all configured as nanosheet transistors (e.g., the GAA NS cell does not include FinFET, planar or nanowire transistors).

As illustrated in FIG. 1, the layout including a plurality of cells (e.g., standard cells) that include NS GAA transistors thus forming GAA NS cells having first cell height (H1) and multiple cell widths (x-direction). The layout further includes a plurality of cells (e.g., standard cells) that include NW GAA transistors thus forming GAA NW cells having formed nanowire GAA transistor having the first cell height (H1) and multiple cell widths (x-direction).

The NW GAA cells and/or the NS GAA cells may each provide a functionality typical of a standard cell such as NAND circuit, a NOR circuit, AND circuit, XOR circuit, XNOR circuit, an inverter, a flipflop, a latch, SACN, and/or other suitable logic or storage functions. These cells may be interconnected to form an IC.

Figure 2:
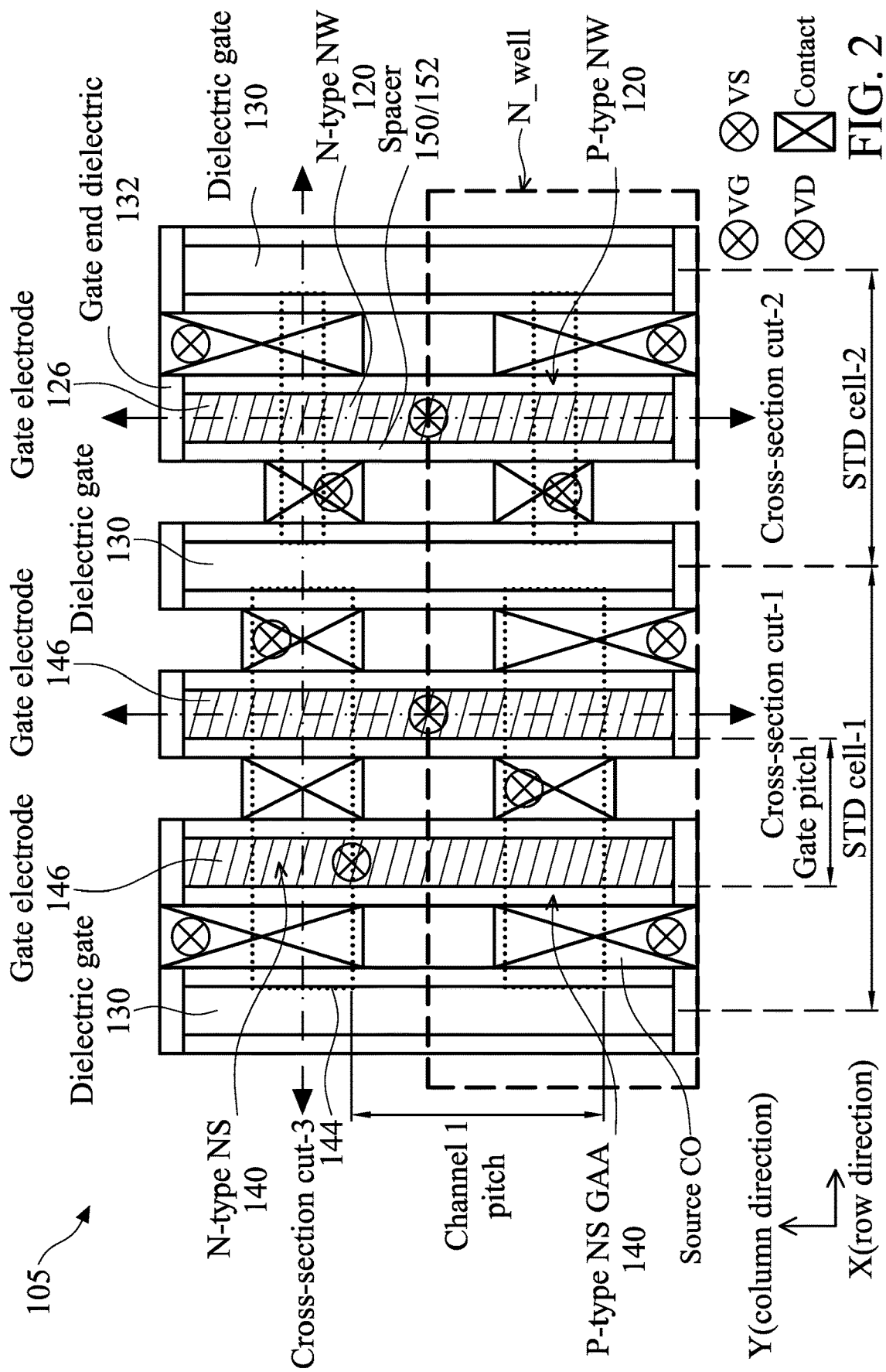
FIG. 2 illustrates a top view of a portion of a first semiconductor structure of FIG. 1, in accordance with some embodiments.

Referring to FIG. 2, shown therein is a layout diagram of a portion of the device region 105, constructed according to an embodiment of the present disclosure. The portion of the device region 105 in this embodiment of FIG. 2 includes an NW cell and a NS cell abutting one another (e.g., within one row as illustrated in FIG. 1). In an embodiment, a first cell is formed by NS GAA devices as provides a NAND circuit functionality. In an embodiment, the first cell, labeled "STD cell-1", is a NS cell as illustrated above in FIG. 1. The STD cell-1 includes two p-type GAA NS devices 140 formed in a N-type well ("N_well") and two n-type GAA NS devices 140. In an embodiment, a second cell, "STD cell-2", is formed by NW GAA devices and provides an inverter circuit. In an embodiment, the second cell is an NW cell of FIG. 1, for example a NW cell abutting a NW GAA within a same row. It includes one p-type GAA NW device 120 formed in the N_well and one n-type GAA NW device 120.

FIG. 2 also illustrates isolation structures including between the first and second cells and at the edges of each of the first and second cell (e.g., which would between adjacent cells as in FIG. 1). Specifically, FIG. 2 shows dielectric dummy gates 130 and gate end dielectric layer 132 at the boundaries of the cells for isolation purposes. FIG. 2 further shows various source and drain contacts and via plugs including gate via plugs ("VG"), drain via plugs ("VD"), and source via plugs ("VS"). The two cells "STD cell-1" and "STD cell-2" have the same height H1 along the column direction Y. The material of the contact comprises single metal material or multiple metal layers. The material of said metal plug selected from a group consist of Ti, TiN, Ni, Mo, Pt, Co, Ru, W, TaN, Cu, or combination.

The dielectric dummy gates 130 comprise one or more dielectric materials. Example dielectric materials include, but are not limited to, SiO2, SiOC, SiON, Si3N4, SiOCN, Carbon content oxide, Nitrogen content oxide, Carbon and Nitrogen content oxide, metal oxide dielectric, Hf oxide (HfO2), Ta oxide (Ta2O5), Ti oxide (TiO2), Zr oxide (ZrO2), Al oxide (Al2O3), Y oxide (Y2O3), multiple metal content oxide, combinations thereof, and/or other suitable materials. The dielectric dummy gates 130 may include a multi-layer configuration. In contrast, the functional gate structures include one or more metal layers such as work function metals, fill metals and the like. The metal layers may be formed over a gate dielectric such as high-k dielectric material. The gate end dielectric layer 132 may include nitride, high-k dielectric, or other suitable dielectric material.

Figure 3:
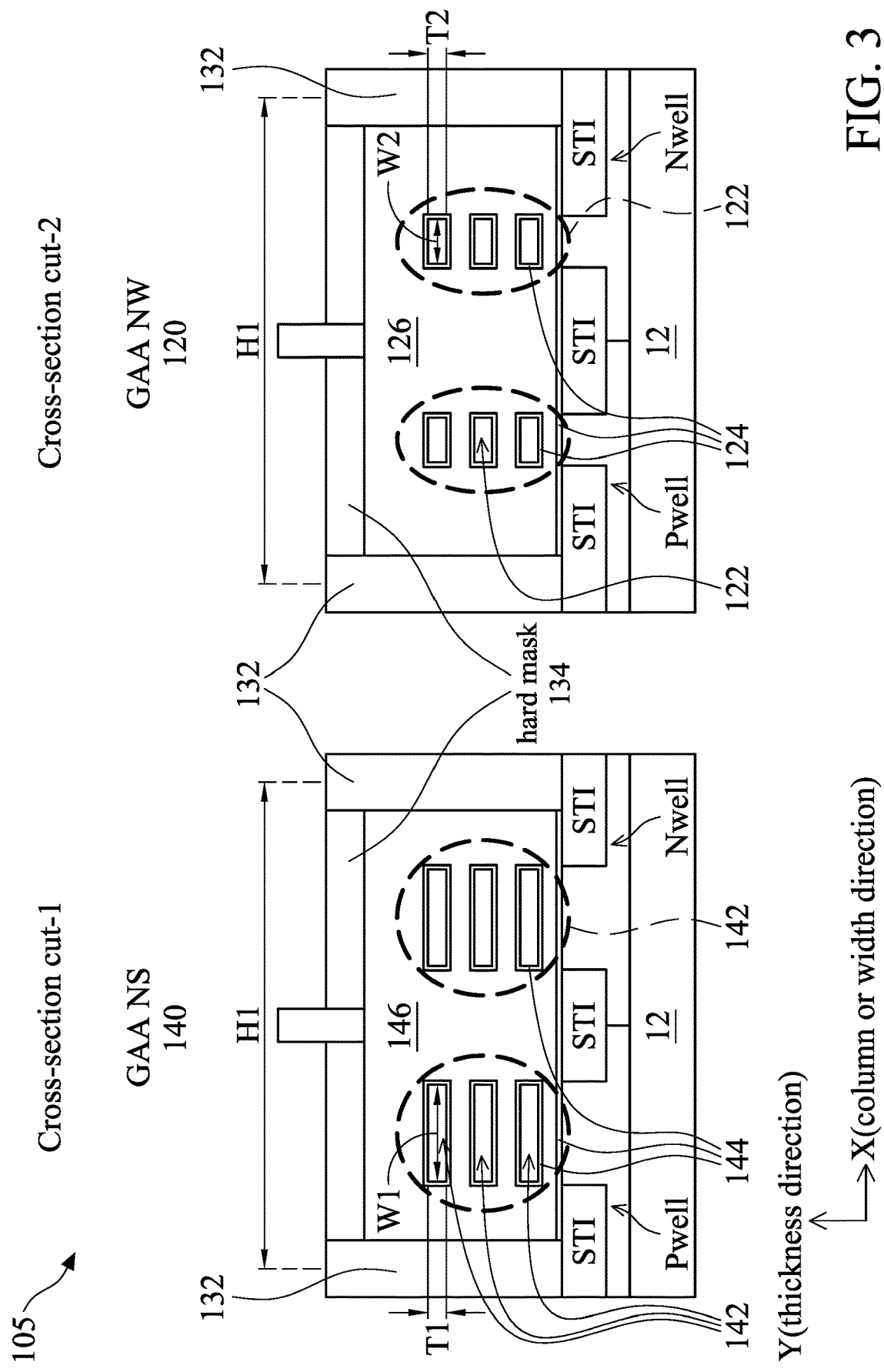
FIGS. 3 and 4 illustrate cross-sectional views of the portion in FIG. 2, in accordance with some embodiments.
Figure 4:
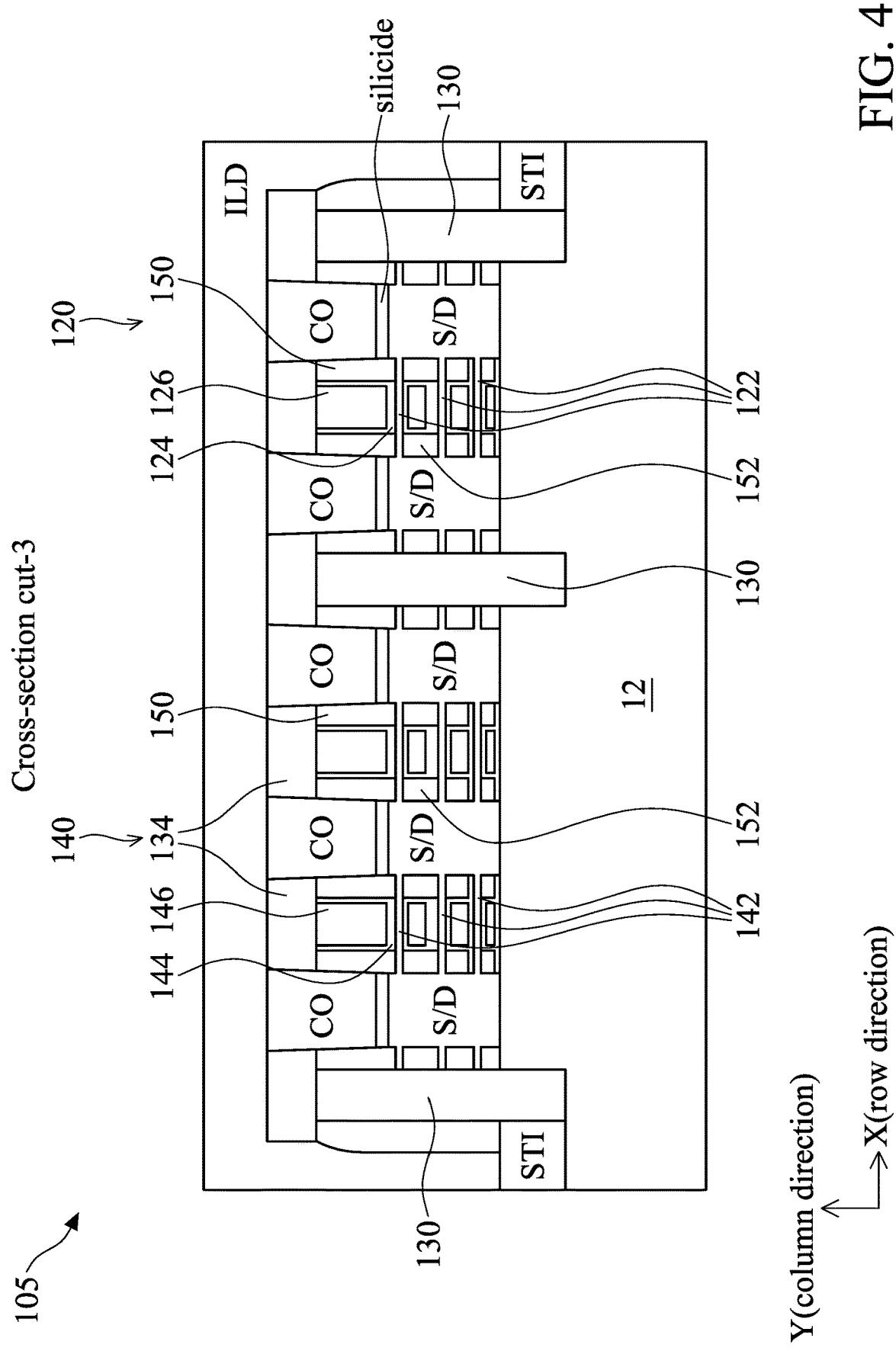

FIG. 3 shows two cross-sectional views of the device region 105 along the "cross-section cut-1" and the "cross-section cut-2" of FIG. 2 which cut along a gate electrode 146 of "STD cell-1" and a gate electrode 126 of "STD cell-2" lengthwise, respectively. FIG. 4 shows a cross-sectional view of the device region 105 along the "cross-section cut-3" of FIG. 2 which cuts along the channel 142 of the "STD cell-1" and the channel 124 of the "STD cell-2" lengthwise.

Referring to FIG. 3, device region 105 includes an NMOSFET GAA NW device 120 and a PMOSFET GAA NW device 120. The NMOSFET GAA NW device 120 is formed over a p-type well "Pwell" and the PMOSFET GAA NW device 120 is formed over an n-type well "Nwell." The Pwell and the Nwell are provided in or on the substrate 12. The substrate 12 may include a silicon substrate (e.g., a silicon wafer) or another semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

Each of the two GAA NW devices 120 includes vertically stacked multiple channels 122. Although FIG. 3 illustrates three channels 122, the GAA NW device 120 may include any number, two or more, of vertically stacked channels 122 in various embodiments. For example, the number of channels 122 in each GAA NW device 120 may be in a range of 2 to 10. Each of the channels 122 includes silicon or another suitable semiconductor material. Each of the channels 122 has a width (or channel width) W2 and a thickness (or channel thickness) T2. The channel width may be measured in a perpendicular direction to the channel or gate length (which is defined as a distance extending from the source to the drain of a transistor, e.g., X direction). In an embodiment, the GAA NW devices and GAA NS devices have a same gate length. Each of the channels 122 is wrapped around by a gate dielectric layer 124, which may include a high-k dielectric material. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, suitable high-k dielectric materials, and/or combinations thereof. A gate electrode 126 wraps around the gate dielectric layer 124. The gate electrode 126 may include one or more work function metal layers and a fill metal layer. In some embodiments, the gate electrodes includes a p-type work function metal (p-metal). Example p-metals include, but are not limited to, TiN, TaN, and a carbon-doped metal nitride such as TaCN. In some embodiments, the gate electrode includes an n-type work function metal (n-metal). Example n-metals include, but are not limited to, Ta, TiAl, and TiAlN. Other work function materials are within the scope of various embodiments, for example, doped conducting oxide materials, TaAl, TiSi, NiSi, PtSi, suitable Ti containing work function materials, suitable Ta containing work function materials, suitable Al containing work function materials, and suitable W containing work function materials. In this embodiment, the PMOSFET and the NMOSFET GAA NW devices 120 each have a gate electrode 126 form as part of a contiguous gate line. The gate end dielectric 132 is disposed over the STI and at the end of the gate electrode 126. A hard mask 134 is disposed over the gate electrode 126.

FIG. 3 also illustrates the device region 105 portion that includes an NMOSFET GAA NS device 140 and a PMOSFET GAA NS device 140. The NMOSFET GAA NS device 140 is formed over a p-type well "Pwell" and the PMOSFET GAA NS device 140 is formed over an n-type well "Nwell." The Pwell and the Nwell are provided in or on the substrate 12. The active regions of the two GAA NS devices 140 are separated by an isolation structure, such as shallow trench isolation (STI). Each of the two GAA NS devices 140 includes vertically stacked multiple channels 142. Although FIG. 3 illustrates three channels 142, the GAA NS device 140 may include any number (e.g., two or more) of vertically stacked channels 142 in various embodiments. For example, the number of channels 142 in each GAA NS device 140 may be in a range of 2 to 10. Each of the channels 142 includes silicon or another suitable semiconductor material. Each of the channels 142 has a width (or channel width) W1 and a thickness (or channel thickness) T1. Each of the channels 142 is wrapped around by a gate dielectric layer 144, which may include a high-k dielectric material. A gate electrode 146 wraps around the gate dielectric layer 144. The gate electrode 146 may include one or more work function metal layers and a bulk metal layer. In this embodiment, the PMOSFET and the NMOSFET GAA NS devices 140 share each have a gate electrode 146 that is a portion of a contiguous gate electrode line. The gate end dielectric 132 is disposed over the STI and at the end of the gate electrode 146. A hard mask 134 is disposed over the gate electrode 146.

In the present embodiment, the number of channels 122 in each GAA NW device 120 is the same as the number of channels 142 in each GAA NS device 140; the materials in the channels 122 are the same or substantially the same as the materials in the channels 142 (e.g., silicon); and the thickness T1 and the thickness T2 are the same or substantially the same. The thicknesses T1 and T2 may be in a range of 3 nm to 8 nm in various embodiments. The gate dielectric layer 124 and the gate dielectric layer 144 have the same or substantially the same thickness, which is 2.5 nm or less in the present embodiment. In the illustrated embodiment, width W1 (of the NS device) is greater than the width W2 (of the NW device). The width W1 is equal to or less than 60 nm and the width W2 is equal to or less than 20 nm. For example, the width W1 is in a range of 12 nm to 40 nm, and the width W2 is in a range of 4 nm to 11 nm in various embodiments. In some embodiments, the width W1 may be up to approximately 100 nm. In some embodiments, the width W2 may be up to approximately 20 nm. In some embodiments, a ratio of W1 to W2 may be in a range of 1.3 to 10, such as from 1.5 to 4. The widths W1 and W2 and the ratio of W1 to W2 are designed to provide sufficient differentiation between the performance of the GAA NS device 140 and the GAA NW device 120. A wider channel in the GAA NS device 140 provides higher drive current $I_{on}$, and a narrower channel in the GAA NW device 120 provides lower leakage and lower power consumption. Thus, the GAA NS device 140 is more suitable for high-speed applications, while the GAA NW device 120 is more suitable for low power and non-speed-critical applications. If the ratio of W1 to W2 is too small (less than 1.3 or near 1.0), then the GAA NS device 140 and the GAA NW device 120 would perform about the same, thus not providing sufficient design flexibility for circuit designers. If the ratio of W1 to W2 is too big (e.g., more than 10), fabrication of both devices on the same IC would be challenging for at least two reasons. One reason is that the channels 142 are formed by etching and removing semiconductor material(s) that is originally disposed between two vertically adjacent channels 142 (such as the silicon germanium layer 111 between adjacent silicon layers 113 in FIG. 16C). Having a wider channel 142 makes it more difficult to etch and remove those semiconductor material(s). Another reason is that having a wider channel 142 makes it more difficult to deposit the gate dielectric layer 144 to wrap around the channel 142. For example, it would be more difficult for the deposited materials to reach the surfaces of the channels 142 if the channels are very wide and the vertical space between the channels is small. Thus, the ratio of W1 to W2 in the present disclosure is limited to about 1.3 to 10, and the values of the W1 and W2 are limited as discussed above. In some embodiments, the gate length of the GAA NW and NS devices may be the same, the gate length perpendicular to the W1/W2 measurement and extending between the source/drain of the respective devices.

Referring to FIG. 4, GAA NW device 120 further includes spacers 150 and 152 disposed on the sidewalls of the gate dielectric layer 124 and the gate electrode 126. The spacer 150 is disposed above the topmost channel in the vertically stacked channels 122 and is also referred to as the outer spacer 150. The spacer 152 is disposed between adjacent two channels 122 and between the bottommost channel 122 and the substrate 12. It is also referred to as the inner spacer 152. The outer spacer 150 and the inner spacer 152 may have the same or different materials. In an embodiment, the outer spacer 150 is formed before the inner spacer 152 is formed. The GAA NS device 140 similarly includes the outer spacer 150 and the inner spacer 152 disposed on the sidewalls of the gate dielectric layer 144 and the gate electrode 146. Example dielectric materials of the spacers include, but are not limited to, SiO2, SiON, Si3N4, SiOCN, low K dielectric (K<3.5), combinations thereof, and/or other suitable materials. Also shown in FIG. 4, there may be a silicide layer between the S/D region and the source/drain contact.

In NMOSFET, the S/D of said N-type GAA transistor may include an epitaxially grown material. The epitaxial material selected from a group consisting of SiP, SiC, SiPC, SiAs, Si, combinations thereof, and/or other suitable materials.

The insulating structure between cells is illustrated as dielectric dummy gate 130. The dielectric gate 130 may comprise silicon oxide, silicon nitride, low-k dielectric material, and/or other suitable materials. Spacer elements may abut the dielectric gate 130. The dielectric gate 130 may extend into the substrate for example in an embodiment having a bottom surface approximately coplanar to a bottom surface of the STI. In some embodiments, a width and/or length of a gate electrode of the functional gates of device 140 and 120 is equal to a corresponding width of the dummy dielectric gate 130.

Figure 5:
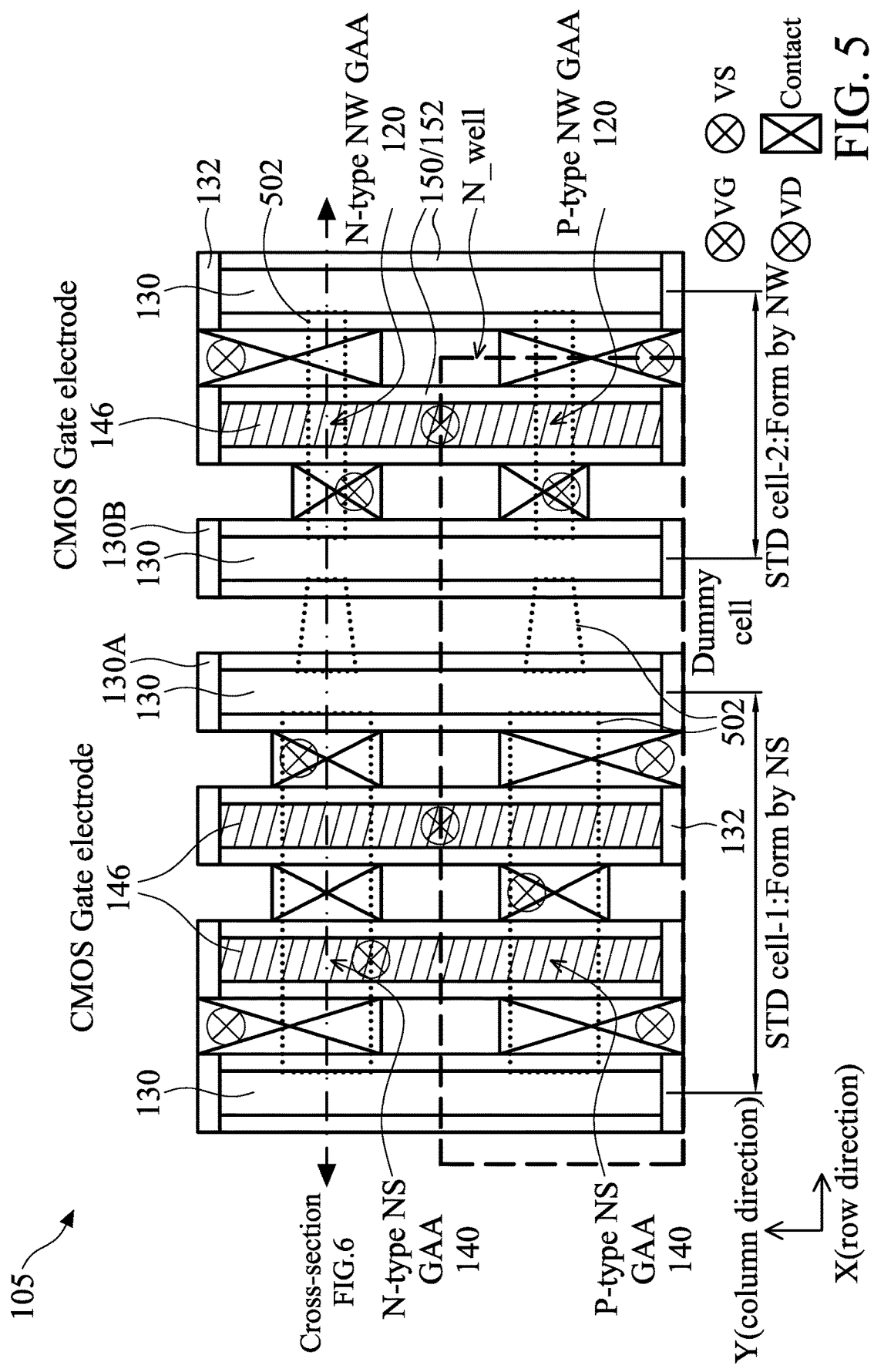
FIG. 5 illustrates a top view of a portion of a second semiconductor structure, in accordance with some embodiments.

Referring to FIG. 5, illustrated is a layout diagram of another portion of the device region 105, constructed according to another embodiment of the present disclosure. The device region 105 in this embodiment illustrates an NS cell and a NW cell abutting one another (e.g., within one row as illustrated in FIG. 1). In an embodiment, a first cell is formed by NS GAA devices as provides a NAND circuit. In an embodiment, the first cell, labeled "STD cell-1", is a NS cell of FIG. 1. It includes two p-type GAA NS devices 140 formed in a N-type well ("N_well") and two n-type GAA NS devices 140. In an embodiment, a second cell, labeled "STD cell-2", is formed by NW GAA devices and provides an inverter circuit. In an embodiment, the second cell is an NW cell of FIG. 1, for example a NW cell abutting a NW GAA within a same row. It includes one p-type GAA NW device 120 formed in the N_well and one n-type GAA NW device 120.

FIG. 5 also illustrates another embodiment of isolation structures including between the first and second cells. Specifically, FIG. 5 shows a plurality of dielectric dummy gates 130 interposing the first and second cells and gate end dielectric layer 132 at the boundaries of the cells for isolation purposes. The dielectric dummy gates 130 may be substantially similar to as discussed above with reference to FIGS. 2 and 4. The two dielectric gates 130 are included in a dummy cell. In an embodiment, the dummy cell is replaced by a filler cell as discussed above with reference to FIG. 1. FIG. 5 further shows various source and drain contacts and via plugs including gate via plugs ("VG"), drain via plugs ("VD"), and source via plugs ("VS"). The two cells "STD cell-1" and "STD cell-2" have the same height H1 along the column direction Y.

A dummy channel region 502 extends from one of the dielectric gates 130 to the other one of the dielectric gates 130. The dummy channel region may decrease in width from adjacent the NS cell to adjacent the NW cell. In an embodiment, the width of the dummy channel region 502 may be substantially equal to the width of the NS and decrease to a thickness substantially equal to the NW width. The dummy channel region 502 may be similarly composed as the channels 122 and/or 142. However, the dummy channel region 502 may be non-functional as, for example, a non-functional dummy dielectric gate 130 overlies the channel. Thus, no current flow is expected in the dummy channel region 502.

Referring to FIG. 5, device region 105 includes an NMOSFET GAA NW device 120 and a PMOSFET GAA NW device 120. The NMOSFET GAA NW device 120 is formed over a p-type well "Pwell" and the PMOSFET GAA NW device 120 is formed over an n-type well "Nwell." The Pwell and the Nwell are provided in or on a substrate 12. The substrate 12 may be substantially similar to as discussed above.

The GAA NW devices 120 and GAA NS devices 140 may be substantially similar to as discussed above. In addition, two dielectric gates 130 interpose the NW devices 120 and the NS devices 140. In other words, two dielectric gates 130 interpose the STD cell-1 and the STD cell-2.

In the present embodiment, the number of channels 122 in each GAA NW device 120 is the same as the number of channels 142 in each GAA NS device 140; the materials in the channels 122 are the same or substantially the same as the materials in the channels 142; and the thickness T1 and the thickness T2 are the same or substantially the same. The channels 122 extend to the dummy gate 130A; the channels 142 extend to the dummy gate 130B. See FIG. 6. In the present embodiment, the number of channels 122 in each GAA NW device 120 is the same as the number of channels 142 in each GAA NS device 140 and is the same as the number of channels in the dummy channel region 502; the materials in the channels 122 are the same or substantially the same as the materials in the channels 142 and the dummy channel region 502; and the thickness T1 and the thickness T2 are the same or substantially the same and are also the same or substantially the same as the thickness of the dummy channel region 502.

The thicknesses T1 and T2 may be in a range of 3 nm to 8 nm in various embodiments. The gate dielectric layer 124 and the gate dielectric layer 144 have the same or substantially the same thickness, which is 2.5 nm or less in the present embodiment. The width W1, of the NS cell, is greater than the width W2, of the NW cell. W1 and W2 are illustrated on FIG. 5 and may be substantially similar to as discussed above, for example, a ratio of W1 to W2 may be in a range of 1.3 to 10, such as from 1.5 to 4. The dummy channel 502 has a decreasing width from W1 to W2 from left to right in FIG. 5 and the cross-sectional view of FIG. 6.

The outer spacer 150 and the inner spacer 152 may be substantially similar to as discussed above. The outer spacer 150 and the inner spacer 152 may have a different dielectric composition than that of the dielectric gate 130.

As discussed above, the dielectric gates 130 may comprise silicon oxide, silicon nitride, low-k dielectric material, and/or other suitable materials. Spacer elements may abut the dielectric gate 130. The dielectric gate 130 may extend into the substrate, for example, in an embodiment the dielectric gate 130 extends about coplanar to a bottom of the STI.

Figure 6:
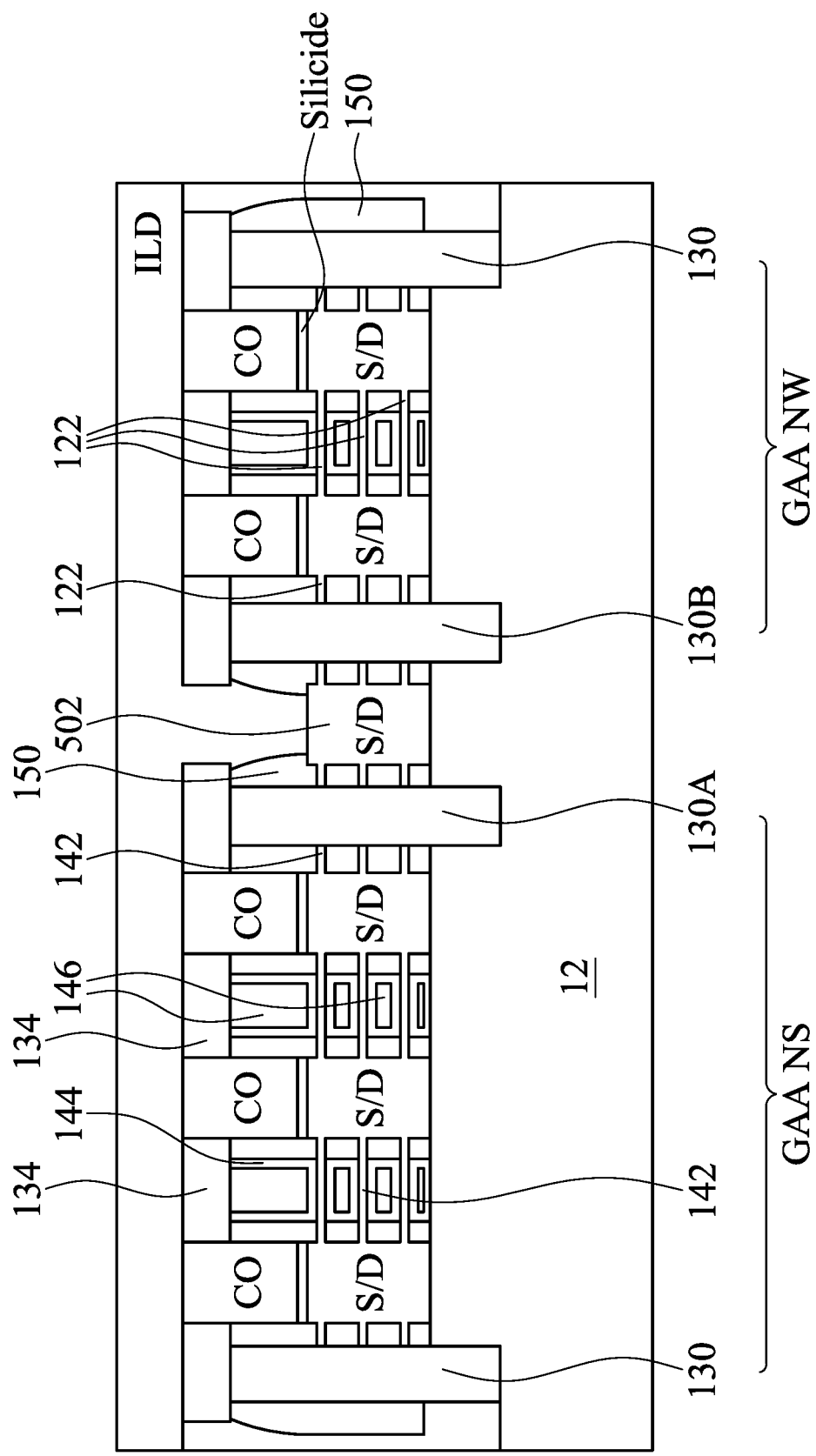
FIG. 6 illustrates cross-sectional view of a portion in FIG. 5, in accordance with some embodiments.

As illustrated in FIG. 6, a contact feature is not formed to the dummy active region 502. Instead, a portion of the interlayer dielectric (ILD) may extend into the region above dummy active region 502.

The dummy active region 502 may include a material substantially similar to the channel layers 142 and 152 respectively. In an embodiment, the dummy active region 502 includes the same material as the active regions (e.g., channel/source/drain) of the NW and NS active transistors and may be formed in the same processes. However, as contact is not provided to the dummy active region 502 it is non-functional. As illustrated in FIGS. 5 and 6, contacts are formed to the functional source/drain regions and gates of the cells. The contacts are formed of conductive materials and provide an electrical connection to the functional gates of the cells. ILD material may be formed above the dummy channel 502 (e.g., no contact is formed thereto).

Comparing the layout diagram of FIG. 5 with that of FIG. 2, it is noted that the two isolation gates located between the S/D nodes illustrated in FIG. 5 may provide increased isolation at the cost of increased area of the substrate.

Figure 7:
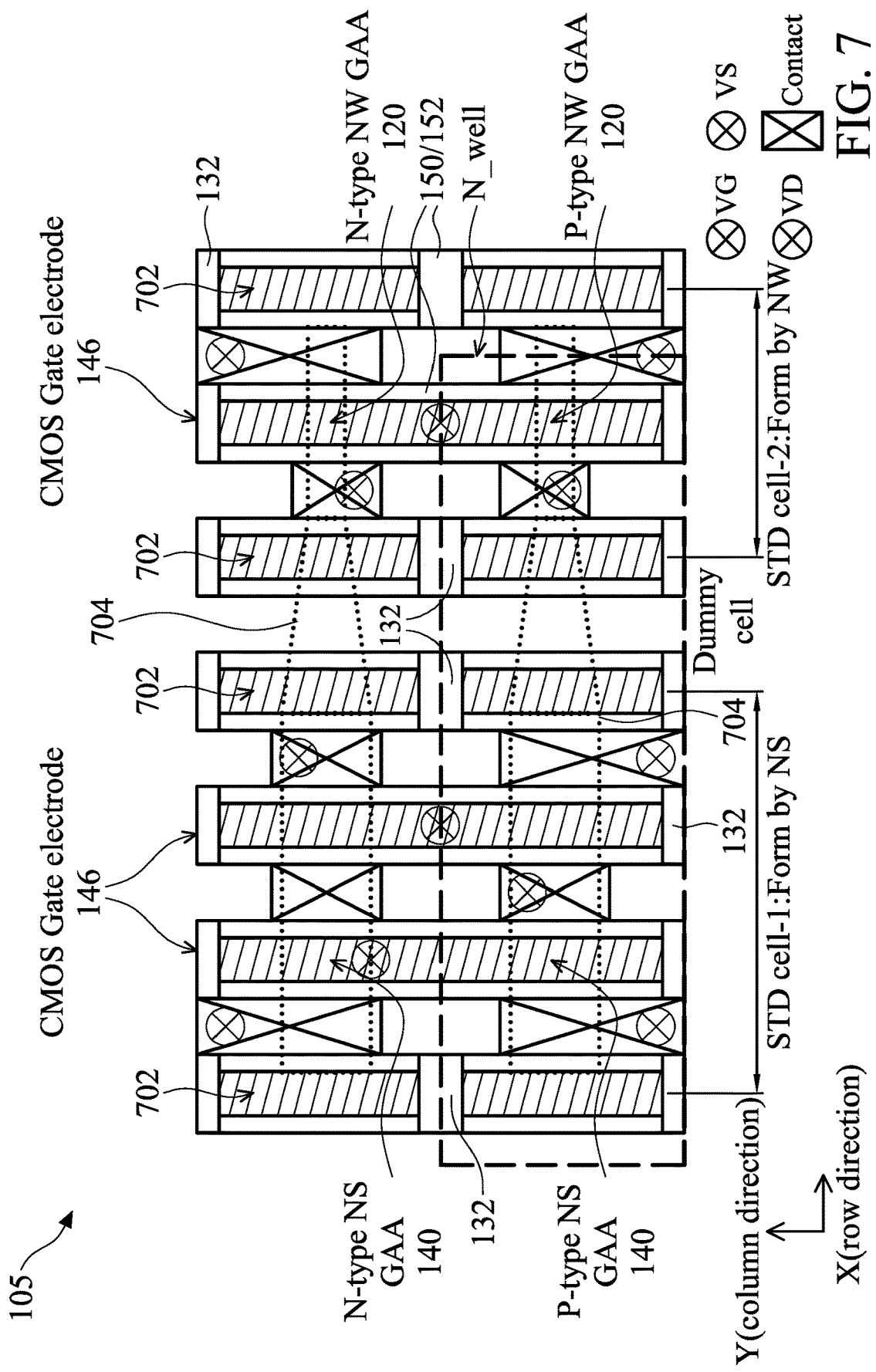
FIG. 7 illustrates a top view of a portion of a third semiconductor structure, in accordance with some embodiments.

Referring to FIG. 7, illustrated a layout diagram of another portion of the device region 105, constructed according to another embodiment of the present disclosure. The device region 105 in this embodiment also includes an NS cell and a NW cell abutting one another (e.g., within one row as illustrated in FIG. 1). In an embodiment, a first cell is formed by NS GAA devices as provides a NAND circuit. In an embodiment, the first cell, "STD cell-1", is a NS cell of FIG. 1. It includes two p-type GAA NS devices 140 formed in a N-type well ("N_well") and two n-type GAA NS devices 140. In an embodiment, a second cell, labeled "STD cell-2", is formed by NW GAA devices and provides an inverter circuit. In an embodiment, the second cell is an NW cell of FIG. 1, for example a NW cell abutting a NW GAA within a same row. It includes one p-type GAA NW device 120 formed in the N_well and one n-type GAA NW device 120.

FIG. 7 also illustrates another embodiment of isolation structures including between the first and second cells. Specifically, FIG. 7 shows a plurality of isolation gates 702 interposing the first and second cells and gate end dielectric layer 132 at the boundaries of the cells for isolation purposes and between portions of the isolation gates 702. The two isolation gates 702 are included in a dummy cell. FIG. 7 further shows various source and drain contacts and via plugs including gate via plugs ("VG"), drain via plugs ("VD"), and source via plugs ("VS"). As noted in FIG. 7, the dummy cell and the isolation gates and dummy channel formed therein do not include contacts thereto. The cells "STD cell-1" and "STD cell-2" as well as the dummy cell have the same height H1 along the column direction Y.

The layout of FIG. 7 is similar to as discussed above with reference to FIGS. 2 and 5 with differences as noted herein. In particular, the isolation is provided by isolation gates 702 and dummy channel region 704 to form the dummy cell between STD cell-1 and STD cell-2. Two isolation gates 702 interpose the NW devices 120 and the NS devices 140. However, additional gates 702 may be possible. In an embodiment, two P-type isolation gates 702 interpose the P-type NW GAA transistors and the P-type NS GAA transistors (see bottom). In an embodiment, two n-type isolation gates 702 interpose the n-type NW GAA transistors and the n-type NS GAA transistors (see bottom).

Isolation gates 702 may include a conductive material substantially similar to the active gates of the functional GAA devices. For example, the isolation gates 702 include a metal work function material and a metal fill layer substantially similar to the adjacent functional gates of that type.

A dummy channel region 704 extends from one of the isolation gates 702 to the other one of the isolation gates 702. The isolation gates 702 may be formed on and surrounding the dummy channel region 704. The dummy channel region 704 may decrease in width from a point adjacent the NS cell (left of FIG. 7) to a point adjacent the NW cell (right of FIG. 7). In an embodiment, the width of the dummy channel region 704 may be substantially equal to the width of the NS and decrease to a thickness substantially equal to the NW width. In other words, the dummy channel region 704 transitions from being configured as a NS to being configured as a NW.

The dummy active region 704 may include a material substantially similar to the channel layers of the NS and NW transistors respectively. In an embodiment, the dummy active region 704 includes the same material as the source/drain of the NW and NS active transistors and may be formed in the same processes. However, as contact is not provided to the dummy active region 704 it is non-functional. As illustrated in the previous embodiment, contacts are formed to the functional source/drain regions and gates of the cells but are not formed to the dummy active region 704. ILD material may be formed above the dummy active region 704 (e.g., no contact is formed thereto).

Referring to FIG. 7, the functional devices may be substantially similar to as discussed above. In particular, the device region 105 includes an NMOSFET GAA NW device 120 and a PMOSFET GAA NW device 120. The NMOSFET GAA NW device 120 is formed over a p-type well "Pwell" and the PMOSFET GAA NW device 120 is formed over an n-type well "Nwell." The Pwell and the Nwell are provided in or on a substrate 12. The substrate 12 may be substantially similar to as discussed above. Each of the devices 120 include a functional gate. The GAA NW devices 120 and GAA NS devices 140 may be substantially similar to as discussed above.

In the present embodiment, the number of channels in each GAA NW device 120 is the same as the number of channels in each GAA NS device 140; the materials in the channels are the same or substantially the same as the materials in the channels; and the thickness of the channels are the same or substantially the same. The channels of the GAA NW devices extend to the isolation gate 702 (left). The channels of the GAA NS devices extend to the isolation gate 702 (right). Between the isolation gates 702 the channels are reduced in width. In the present embodiment, the number of channels in each GAA NW device 120 is the same as the number of channels in each GAA NS device 140 and the dummy channel regions 704; the materials in the channels are the same or substantially the same as the materials in the channels; and the thickness of the channels are the same or substantially the same.

The width of channels of the NS is greater than the width of channels of the NS as illustrated in FIG. 7. For example, a ratio of width NS to width NW may be in a range of 1.3 to 10, such as from 1.5 to 4.

As illustrated a contact feature is not formed to the dummy active region 704. Instead, a portion of the interlayer dielectric (ILD) may extend into the region above dummy active region 704 as shown in the embodiment of FIG. 6. Similarly, a contact is not formed to isolation gates 702. Again, the isolation gates 702 may be metal gates and include materials substantially similar to those gates of the NS and NW transistors of STD-Cell 1 and STD-Cell 2; however, the isolation gates 702 may be non-functional.

Figure 8:
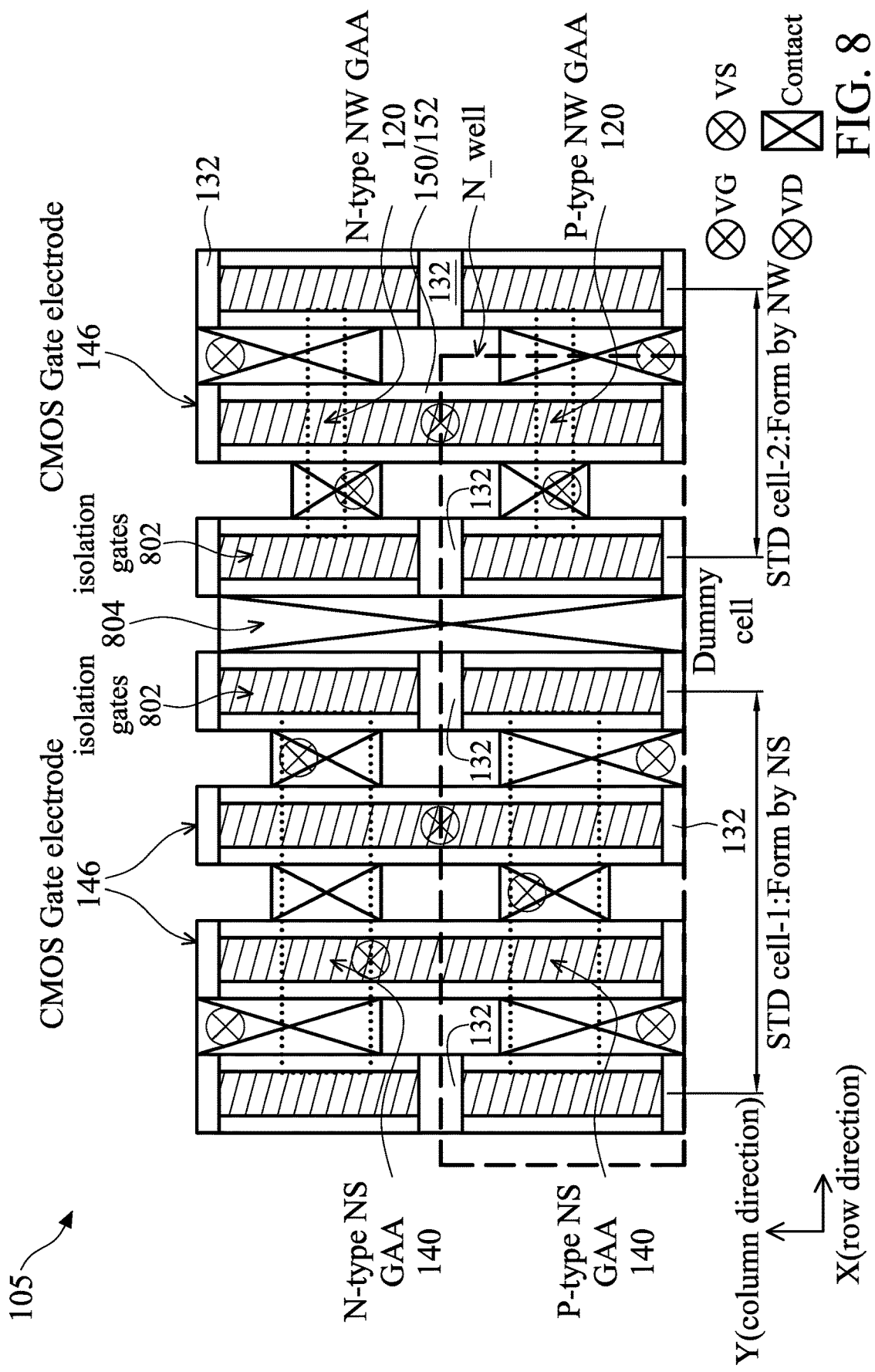
FIG. 8 illustrates a top view of a portion of a fourth semiconductor structure, in accordance with some embodiments.

FIG. 8 also illustrates another embodiment of isolation structures including between the first and second cells. Specifically, FIG. 8 shows a plurality of isolation gates 802 including two isolation gates 802 interposing the first and second cells, gate end dielectric layer 132 at the boundaries of the cells for isolation purposes and between portions of the isolation gates 802. The two isolation gates 802 interposing STD cell-1 and STD cell-2 are included in a dummy cell. FIG. 8 further shows various source and drain contacts and via plugs including gate via plugs ("VG"), drain via plugs ("VD"), and source via plugs ("VS"). As noted in FIG. 8, the dummy cell and the isolation gates 802 formed therein include a contact 804 formed between the isolation gates 802. The cells "STD cell-1" and "STD cell-2" as well as the dummy cell may have the same height H1 along the column direction Y.

The layout of FIG. 8 is similar to as discussed above with reference to FIGS. 2, 5, and 7 with differences as noted herein. In particular, the isolation is provided by isolation gates 802 and the contact 804. In an embodiment, the contact 804 interfaces the STI. The two isolation gates 802 interposing the NW devices 120 and the NS devices 140 and the contact 804 to form the dummy cell between STD cell-1 and STD cell-2. In an embodiment, the isolation gates 802 may comprise material substantially similar to those of NW devices 120 and NS devices 140, however, they may not be connected to provide functionality (e.g., there is no channel region).

Isolation gates 802 may include a conductive material substantially similar to the active gates of the functional GAA devices. For example, the isolation gates 802 include a metal work function material and a metal fill layer substantially similar to the adjacent functional gates of that type.

Referring to FIG. 8, the functional devices may be substantially similar to as discussed above. In particular, the device region 105 includes an NMOSFET GAA NW device 120 and a PMOSFET GAA NW device 120. The NMOSFET GAA NW device 120 is formed over a p-type well "Pwell" and the PMOSFET GAA NW device 120 is formed over an n-type well "Nwell." The Pwell and the Nwell are provided in or on a substrate 12. The substrate 12 may be substantially similar to as discussed above. Each of the devices 120 include a functional gate. The GAA NW devices 120 and GAA NS devices 140 may be substantially similar to as discussed above.

In the present embodiment, the number of channels in each GAA NW device 120 is the same as the number of channels in each GAA NS device 140; the materials in the channels are the same or substantially the same as the materials in the channels; and the thickness of the channels are the same or substantially the same. The channels of the GAA NW devices extend to the isolation gate 802 (left). The channels of the GAA NS devices extend to the isolation gate 802 (right). The channel material may be removed between the gates such that a contact 804 extends to the substrate (e.g., an STI).

It is noted that the contact 804 may not provide an electrical connection to the dummy cell. For example, the contact may not be further connected to the MLI (e.g., by via or other interconnection). In an embodiment, the contact 804 provides for etch loading effect improvements by improving the distribution of contact features. In an embodiment, the contact 804 may be interconnected to another cells' signal.

Figure 9:
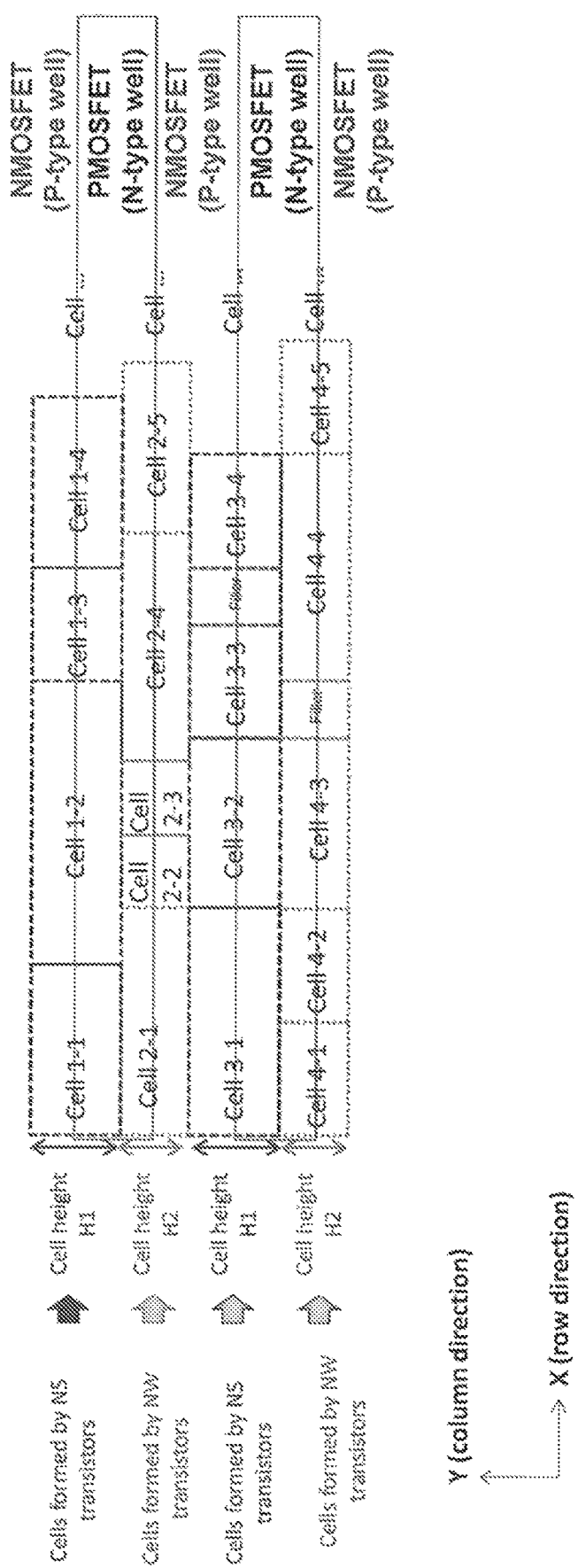
FIG. 9 shows another standard cell array layout diagrams of a portion of the semiconductor structure, according to aspects of the present disclosure.

Referring to FIG. 9, shown therein is a layout diagram of a portion of the device region 900, constructed according to another embodiment of the present disclosure. The device region 900 includes a plurality of GAA NS cells and GAA NW cells arranged in columns and rows, similar to as discussed above with reference to FIG. 1. However, FIG. 9 illustrates each row includes only one type of cells, either all NS cells or all NW cells. Further, the rows having all NS cells (referred to as "NS rows") and the rows having all NW cells (referred to as "NW rows") are alternately arranged. However, this is not required and there may be more rows of one type of cell (e.g., NW or NS) than the other type of cell (e.g., other of NW and NS). Each NS row has a height H1 along the column direction Y that is greater than the height H2 of the NW row. This may be because the GAA NS device (in the NS row) has a wider channel than the GAA NW device (in the NW row). In an embodiment, the NS cells include transistors with a channel width greater than the transistors of the NW cell. For example, the ratio of widths may be between approximately 1.3 and approximately 10, in a further embodiment between approximately 1.5 and approximately 3. The width of the NS transistors (e.g., W1) may be between approximately 12 nanometers and 40 nanometers. The width of the NW transistors (e.g., W2) may be between approximately 4 nanometers and 11 nanometers. In an embodiment, the dimension ratio of H1 to H2 is within a range of approximately 1.1 to approximately 2. The thicknesses of the layers of the GAA devices may be in a range of approximately 3 nm to approximately 8 nm. In some embodiments, the gate length (defined in the direction of the channel length between the source and drain) is approximately equal between the NW transistors and NS transistors (see, e.g., the x-direction of FIG. 10).

Further, some of the rows in this layout may further include "filler" cells as discussed above. The filler cells may include dummy structures such as discussed herein including with respect to FIGS. 2, 5, 7 and 8.

Figure 10:
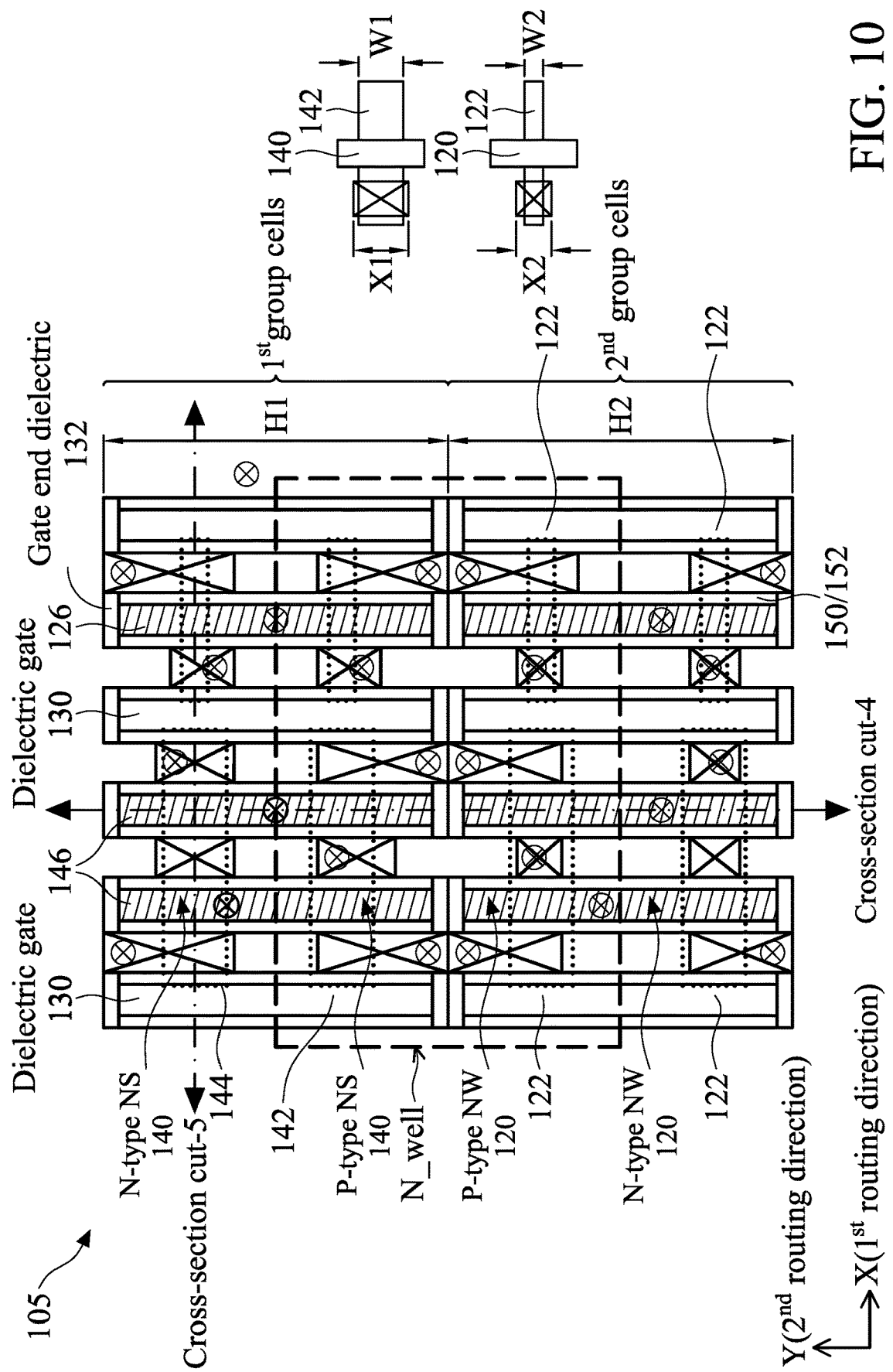
FIG. 10 illustrates a top view of a portion of a fifth semiconductor structure, in accordance with some embodiments.

FIG. 10 illustrates a top view of a portion of the device region 105 that includes multiple standard cells placed according to, for example, the layout diagram shown in FIG. 1 or FIG. 9. Referring to the example of FIG. 10, the device region 105 includes a first group of NS cells arranged in a row and a second group of NW cells arranged in another row below the first row (see FIG. 9). Each NS cell includes a pair of an NMOSFET (or n-type) GAA NS device 140 and a PMOSFET (or p-type) GAA NS device 140. Each NW cell includes a pair of an NMOSFET (or n-type) GAA NW device 120 and a PMOSFET (or p-type) GAA NW device 120. The NS cells have a cell height H1, and the NW cells have a cell height H2, where H1 is greater than H2. The device region 105 includes dielectric dummy gates 130 at the boundaries of the cells and being parallel to the gate electrodes 126 and 146 lengthwise (along the "Y" direction). The device region 105 further includes gate end dielectric 132 at both ends of each of the gate electrodes 126 and 146 and the dielectric gates 130. The channels 122 and 144 are oriented lengthwise along the row direction (the "X" direction), perpendicular to the gate electrodes 126 and 146. The widths of the channels 124 and 144 are W2 and W1 respectively, as discussed above. The device region 105 further includes source contacts "Source CO" and drain contacts "Drain CO" (collectively "S/D contacts"). The S/D contacts of the NS cells has a width X1 along the "Y" direction, the S/D contacts of the NW cells have a width X2 along the "Y" direction, where X1 is greater than X2. For example, a ratio of X1 to X2 may be in a range of 1.1 to 5. This is to accommodate the fact that W1 is greater than W2 and a ratio of W1 to W2 is in a range of 1.3 to 10 as discussed above. The S/D contacts of the NS cells have a length Y1 along the "X" direction, the S/D contacts of the NW cells have a length X2 along the "X" direction. In some embodiments, Y1 is equal to Y2. In some embodiment, Y2 is larger than Y1 by approximately 10% or greater. The different contact sizes for NS GAA device (X1) and NW GAA device (X2) allow for contact Rc and capacitance co-optimization.

Figure 11:
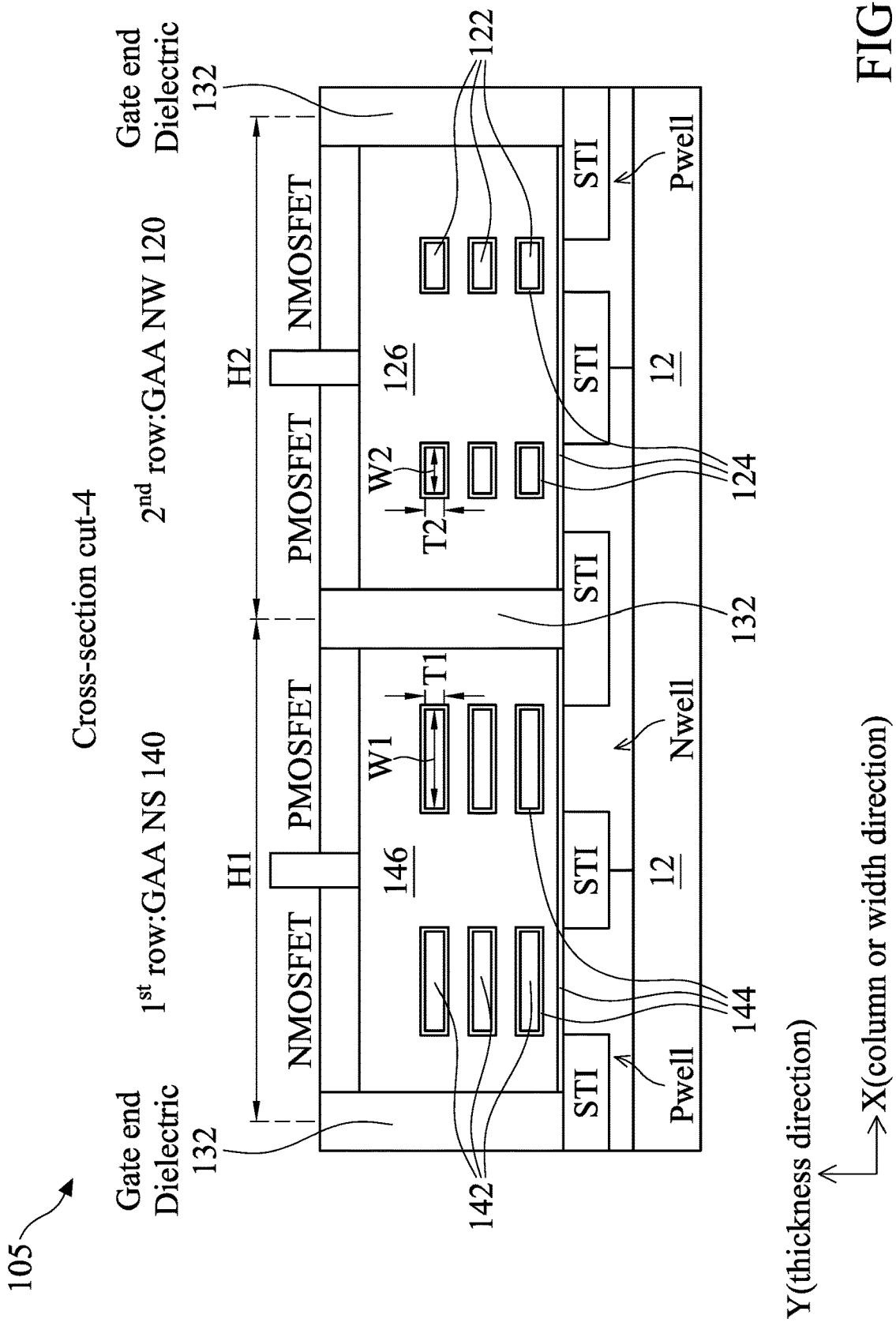
FIGS. 11-12 illustrate cross-sectional views of a portion in FIG. 10 in accordance with some embodiments.

FIG. 11 shows a cross-sectional view of the device region 105 along the "cross-section cut-4" of FIG. 10, which cuts along the gate electrodes 126 and 146 lengthwise. Referring to the example of FIG. 11, the device region 105 includes an NS cell abutting an NW cell. The NS cell includes a PMOSFET GAA NS device 140 and an NMOSFET GAA NS device 140. The NW cell includes a PMOSFET GAA NW device 120 and an NMOSFET GAA NW device 120. The gate electrode 146 of the NS cell and the gate electrode 126 of the NW cell are separated by the gate end dielectric 132. The NS cell has a height H1 and the NW cell has a height H2, where H1 is greater than H2. Other aspects of the device region 105 in FIG. 11 are the same as those described above, with like reference numerals representing like features. Thus, the details of FIG. 11 are omitted here for simplicity.

Figure 12:
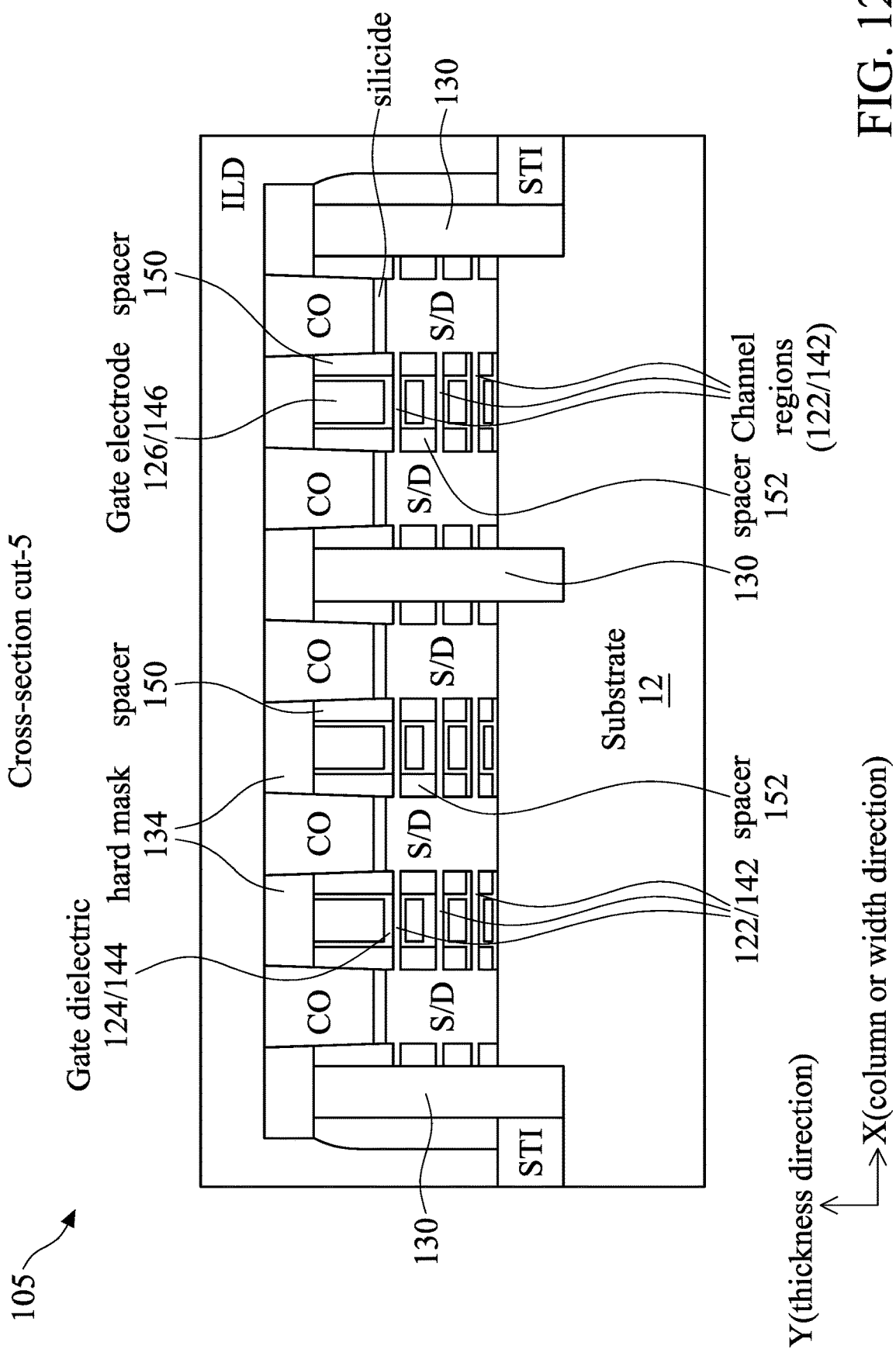

FIG. 12 shows a cross-sectional view of the device region 105 along the "cross-section cut-5" of FIG. 10 which cuts along the channel 142 of the GAA NS devices. Notably, the device region 105 has a similar cross-sectional view when cut along the channel 122 of the GAA NW devices. Therefore, FIG. 12 is labeled with features of both GAA NW devices and GAA NS devices. Referring to the example of FIG. 12, the device region 105 includes the substrate 12 and wells formed over the substrate 12. The wells can be either n-type doped (for PMOSFET GAA NS or NW devices) or p-type doped (for NMOSFET GAA NS or NW devices) depending on where the cross-section is taken in FIG. 10. The GAA NS or NW devices are over the wells and have channels 142 or 122, gate dielectric layers 144 or 124, gate electrodes 146 or 126, outer spacers 150, inner spacers 152, source/drain features, source/drain contacts, and silicide features, all substantially similar to as discussed above. Also, adjacent cells are isolated by dielectric dummy gates 130. The device region 105 further includes STI features, hard mask 134 over the gate electrodes 126/146 and the outer spacer 150, and an inter-layer dielectric (ILD) layer over the cells. Many aspects of the device region 105 in FIG. 12 are the same as those discussed above and can be applied to the embodiment of FIG. 12.

Figure 13:
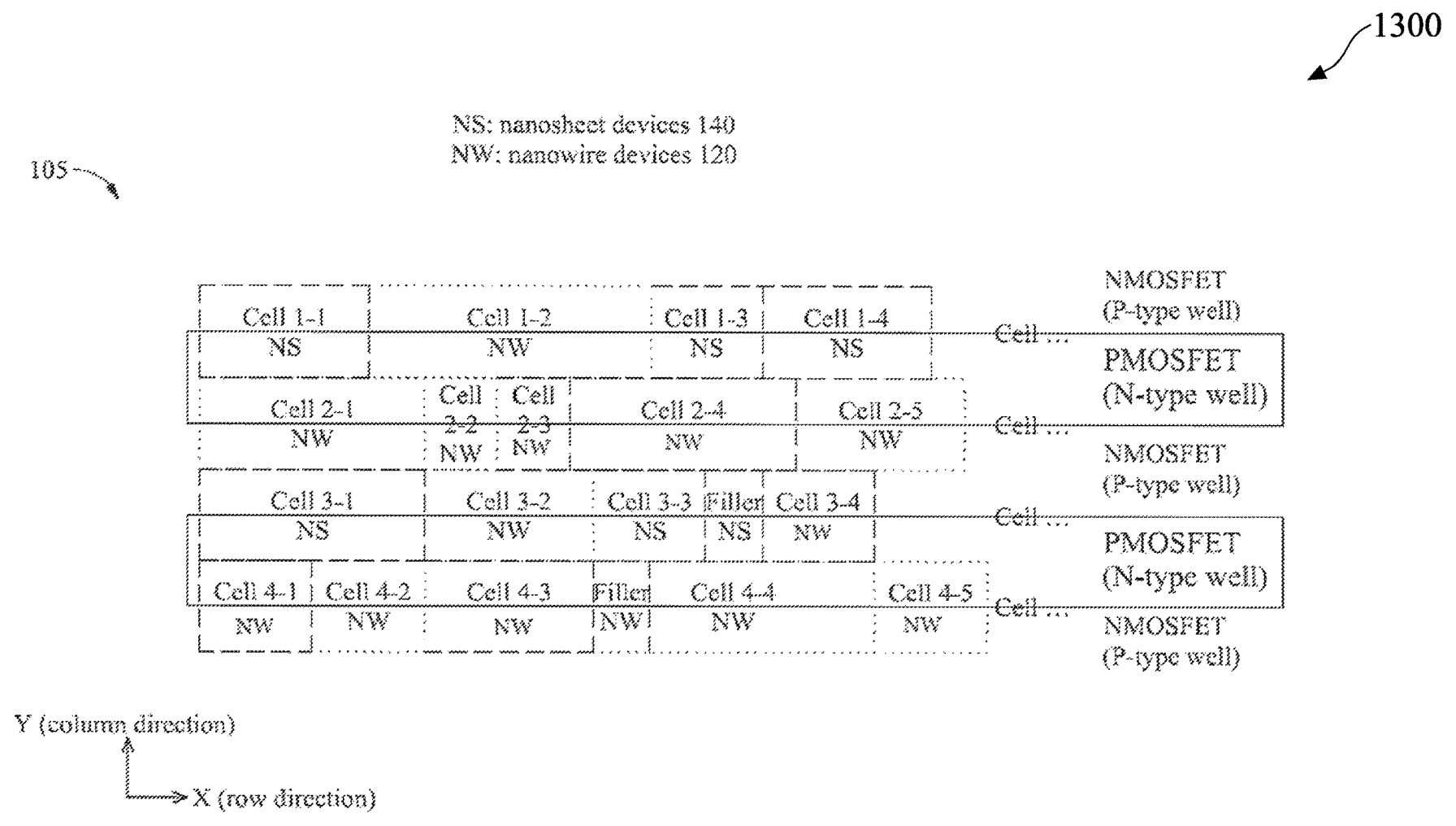

Referring now to FIG. 13, shown therein is a layout diagram 1300 of another portion of the device region 105, constructed according to yet another embodiment of the present disclosure. The device region 105 in this embodiment also includes NS cells and NW cells arranged in columns and rows. However, in this embodiment, some rows are mixed rows (including NW cells abutting NS cells), and other rows are NW rows, where the mixed rows and the NW rows are alternately arranged. Some of the mixed rows may include filler cell(s) which may be either an NS filler cell or an NW filler cell. Some of the NW rows may also include filler cell(s) which are NW filler cell(s). The isolation structures discussed above may be used to interpose the NW cells and NS cells of the mixed rows.

As illustrated in FIG. 13, the rows have different heights. In a row comprising a "mixed group" of NS and NW cells, thus including NS and NW transistors respectively, has a height H1. A second row comprising only NW cells, and thus only NW transistors has a height H2. In an embodiment, the ratio of H1 to H2 is between approximately 1.1 and approximately 2. In an embodiment, a width (e.g., W1) of the channel in the NS cells to the width (e.g., W2) of the channel in the NW cells is between approximately 1.3 and approximately 10. As discussed above, the number of channel regions in the NW and NS devices may be the same and may be in the range of 2 to 10.

As also discussed above, the dielectric dummy gate 130 includes a dielectric material (e.g., is not conductive). The material of said dummy dielectric gate can be single dielectric layer or multiple layers and selected from a group consisting of $SiO_2$, SiOC, SiON, SiOCN, Carbon content oxide, Nitrogen content oxide, Carbon and Nitrogen content oxide, metal oxide dielectric, Hf oxide (HfO2), Ta oxide (Ta2O5), Ti oxide (TiO2), Zr oxide (ZrO2), Al oxide (Al2O3), Y oxide (Y2O3), multiple metal content oxide, or combination.

Although not intended to be limiting, one or more embodiments of the present disclosure provide many benefits to a semiconductor device and the formation thereof. For example, embodiments of the present disclosure provide high performance GAA NS devices, low leakage GAA NW devices can be formed on the same substrate and in the same integrated circuit. The present embodiments enable circuit designers to optimize the circuits in different areas of the IC by choosing different types of devices. Various isolation features such as dielectric gates or isolation gates are used between adjacent NS and NW cells. These isolation features in some embodiments provide for an 'active region' that is non-functional (dummy) but decreases in width from that associated with the NW transistor to that associated with the NS transistor. In one aspect, the present disclosure is directed to an integrated circuit. The integrated circuit includes a substrate.

A first cell including a first gate-all-around (GAA) nanowire transistor on the substrate with vertically stacked multiple nanowire channels, a second cell comprising a second GAA nanosheet transistor on the substrate transistor having vertically stacked multiple nanosheet channels, and an isolation structure interposing the first cell and the second cell. The first GAA nanowire transistor includes a first gate dielectric layer wrapping around the nanowire channels and a first gate electrode wrapping around the first gate dielectric layer. The second GAA nanosheet transistor includes a second gate dielectric layer wrapping around the nanosheet channels, and a second gate electrode wrapping around the second gate dielectric layer.

In some embodiments, the isolation structure is a dielectric gate. In some embodiments, the isolation structure is a metal gate. In some embodiments, the first cell and the second cell each have a first height in a first direction. In a further embodiment, the first cell has a first width in a second direction and the second cell has a second width in the second direction. The second width may be greater than the first width. In some embodiments, the nanowire channels have a first width and the nanosheet channels have a second width. A ratio of the second width to the first width may be in a range of approximately 1.3 to 10. In some embodiments, the isolation structure includes two dielectric gates. For example, in a further embodiment, two dielectric gates extend into the substrate. In some embodiments, the isolation structure includes a dummy channel region.

In another of the broader embodiments discussed herein, an integrated circuit is provided that includes an array of cells formed on a substrate. A first row of the array of cells includes a first cell comprising a first gate-all-around (GAA) nanowire transistor and a second cell comprising a second GAA nanosheet transistor. The second cell is a next adjacent cell in the first row to the first cell (e.g., no (functional) cells interpose the first and second cells). An isolation structure may interpose the first cell and the second cell.

In some embodiments, the IC further includes a second row of the array of cells, wherein the second row consists of cells with nanowire transistors. In some embodiments, the isolation structure includes a non-functional gate. In some embodiments, the first GAA nanowire transistor has a first channel width and the second GAA nanosheet transistor has a second channel width. A ratio of the second channel width to the first channel width may be between approximately 1.3 and 10. In some embodiments, the first GAA nanowire transistor and the second GAA nanosheet transistor have a same gate length. In some embodiments, a first GAA nanowire transistor and the second GAA nanosheet transistor have a same gate dielectric thickness. In some embodiment, a gate end dielectric structure is formed on a face of a gate end of the first GAA nanowire transistor. The gate end dielectric structure provides an isolation to a cell of a second row of the array of cells.

In another of the broader embodiments discussed herein, an integrated circuit is provided that includes a first row of an array of cells and a second row of cells disposed on a substrate. The first row includes a first cell comprising a first gate-all-around (GAA) nanowire transistor on the substrate. The first GAA nanowire transistor has vertically stacked multiple nanowire channels. A first gate dielectric layer wraps around the nanowire channels and a first gate electrode wraps around the first gate dielectric layer. The first row further includes a second cell comprising a second GAA nanosheet transistors on the substrate, the second GAA nanosheet transistor having vertically stacked multiple nanosheet channels, a second gate dielectric layer wrapping around the nanosheet channels, and a second gate electrode wrapping around the second gate dielectric layer. An isolation structure interposes the first cell and the second cell in the first row. The second row includes a third cell and a fourth cell. The third cell includes a third GAA nanowire transistor and the fourth cell includes a fourth GAA nanowire transistor.

In some embodiments, the third cell is a next adjacent cell to the fourth cell. In some embodiments, the nanosheet channels and nanowire channels extend to interface the isolation structure. In some further embodiments, the isolation structure is a dielectric gate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first cell comprising a first gate-all-around (GAA) nanowire transistor over a substrate, the first GAA nanowire transistor has vertically stacked multiple nanowire channels, a first gate wrapping around the vertically stacked multiple nanowire channels;
   a second cell comprising a second GAA nanosheet transistor over the substrate, the second GAA nanosheet transistor having vertically stacked multiple nanosheet channels, a second gate wrapping around the vertically stacked multiple nanosheet channels; and
   an isolation structure interposing the first cell and the second cell, wherein the isolation structure includes at least two isolation gates and a contact.

2. The integrated circuit of claim 1, wherein the isolation structure is a dielectric gate.

3. The integrated circuit of claim 1, wherein the isolation structure is a metal gate.

4. The integrated circuit of claim 1, wherein the first cell and the second cell each have a first height in a first direction.

5. The integrated circuit of claim 4, wherein the first cell has a first width in a second direction perpendicular to the first direction and the second cell has a second width in the second direction, wherein the second width is greater than the first width.

6. The integrated circuit of claim 1, wherein at least one of the nanowire channels have a first width in a first dimension and the nanosheet channels have a second width in the first dimension, wherein a ratio of the second width to the first width is in a range of 1.3 to 10.

7. The integrated circuit of claim 1, wherein the contact interposes a first isolation gate and a second isolation gate of the at least two isolation gates.

8. The integrated circuit of claim 1, wherein each of the at least two isolation gates includes spacer elements.

9. The integrated circuit of claim 1, wherein the contact extends to a shallow trench isolation (STI) feature between the first cell and the second cell.

10. An integrated circuit, comprising:
a first cell comprising a first gate-all-around (GAA) nanowire transistor over a substrate, the first GAA nanowire transistor having vertically stacked multiple nanowire channels and a first gate wrapping around the vertically stacked multiple nanowire channels;
a second cell comprising a second GAA nanosheet transistor over the substrate, the second GAA nanosheet transistor having vertically stacked multiple nanosheet channels and a second gate wrapping around the vertically stacked multiple nanosheet channels; and
an isolation structure interposing the first cell and the second cell, wherein the isolation structure includes at least two isolation gates and a dummy channel region wherein the dummy channel region decreases in dimension from a first point adjacent the first cell to a second point adjacent the second cell.

11. The integrated circuit of claim 10, wherein the decrease in dimension is a decrease from a first measurement to a second measurement in a first direction, the first measurement equal to a channel width of the nanowire channels and the second measurement equal to a channel width of the nanosheet channels.

12. The integrated circuit of claim 11, wherein the channel width of the nanosheet channels is between approximately 1.3 and 10 times greater than the channel width of the nanowire channels.

13. The integrated circuit of claim 10, wherein the at least two isolation gates include a metal gate.

14. The integrated circuit of claim 10, wherein the at least two isolation gates include a dielectric gate.

15. The integrated circuit of claim 14, wherein the dielectric gate extends into the substrate.

16. The integrated circuit of claim 10, wherein the first point adjacent the first cell is under dielectric gate of the at least two isolation gates and wherein the second point adjacent the second cell is under another dielectric gate of the at least two isolation gates.

17. An integrated circuit, comprising:
a first gate-all-around (GAA) nanowire transistor over a substrate, the first GAA nanowire transistor has vertically stacked multiple nanowire channels, a first gate wrapping around the vertically stacked multiple nanowire channels;
a second GAA nanosheet transistor over the substrate, the second GAA nanosheet transistor having vertically stacked multiple nanosheet channels, a second gate wrapping around the vertically stacked multiple nanosheet channels; and
an isolation structure interposing the first GAA nanowire transistor and the second GAA nanosheet transistor, wherein the isolation structure includes at least one of a dielectric gate or a metal gate.

18. The integrated circuit of claim 17, wherein the isolation structure is two gates.

19. The integrated circuit of claim 18, wherein a contact interposes the two gates.

20. The integrated circuit of claim 17, wherein the isolation structure is a dielectric gate.

* * * * *